United States Patent
Tiwari et al.

(10) Patent No.: US 8,212,547 B2
(45) Date of Patent: Jul. 3, 2012

(54) SYSTEM AND METHOD FOR ON-CHIP DUTY CYCLE MEASUREMENT

(75) Inventors: Anurag Ramesh Tiwari, Uttar Pradesh (IN); Kallol Chatterjee, Uttar Pradesh (IN)

(73) Assignee: STMicroelectronics International N.V., Amsterdam (NL)

( * ) Notice: Subject to any disclaimer, the term of this patent is extended or adjusted under 35 U.S.C. 154(b) by 510 days.

(21) Appl. No.: 12/507,686

(22) Filed: Jul. 22, 2009

(65) Prior Publication Data

US 2010/0019757 A1  Jan. 28, 2010

(30) Foreign Application Priority Data

Jul. 24, 2008 (IN) .......................... 1741/DEL/2008

(51) Int. Cl.
*G01R 23/175* (2006.01)
*G01R 35/00* (2006.01)
*H03H 11/26* (2006.01)

(52) U.S. Cl. ............... 324/76.12; 327/251; 327/169; 327/395; 327/400; 340/527; 702/89; 702/79; 324/76.54

(58) Field of Classification Search ............... 324/76.12, 324/76.11, 76.39, 76.52, 76.54; 702/1, 57, 702/79, 85; 340/12.14, 12.1, 527, 501; 361/28, 361/83, 89, 160, 195, 91.3, 75, 94; 327/158, 327/156, 161, 237, 250, 251, 252, 261, 269, 327/271, 395, 400
See application file for complete search history.

(56) References Cited

U.S. PATENT DOCUMENTS

| | | | | |
|---|---|---|---|---|
| 7,317,294 B2 * | 1/2008 | Ko | ............................ | 318/603 |
| 7,701,192 B2 * | 4/2010 | McCoy et al. | ............. | 324/76.11 |
| 2006/0245130 A1 * | 11/2006 | Otsuka et al. | .................. | 361/75 |
| 2008/0288196 A1 * | 11/2008 | Singh et al. | ..................... | 702/79 |
| 2010/0171529 A1 * | 7/2010 | Chatterjee et al. | ............. | 327/31 |

OTHER PUBLICATIONS

Chan et al., "A Jitter Characterization System Using a Component-Invariant Vernier Delay Line," IEEE Trans. on VLSI Systems. 12(1):79-95, Jan. 2004.
Ogawa et al., "A 50% Duty-Cycle Correction Circuit for PLL Output," 0-7803-7448-7/02, IEEE, pp. IV 21-24, 2002.

* cited by examiner

*Primary Examiner* — Hoai-An D Nguyen
(74) *Attorney, Agent, or Firm* — Seed IP Law Group PLLC

(57) ABSTRACT

An apparatus and method for measuring the duty cycle of a clock signal, the apparatus having a first multi-tap delay module, a second multi-tap delay module, and a multi-element detecting module, the input terminal of the first multi-tap delay module and the input terminal of the second multi-tap delay module coupled to an input node IN, the first multi-tap delay module receiving the clock signal and then providing it a first constant incremental delay at each tap, the second multi-tap delay module receiving the same clock signal CLK and then providing it a second constant incremental delay at each tap, and the multi-element detecting module determining the ratio of the number of outputs of the multi-element detecting module in which the sampled clock level is high with respect to the total number of steps covering one complete clock cycle.

17 Claims, 4 Drawing Sheets

SYSTEM AND METHOD FOR ON-CHIP DUTY CYCLE MEASUREMENT

BACKGROUND

1. Technical Field

The present disclosure relates to the field of integrated circuits and, more specifically, to a system and method for on-chip duty cycle measurement.

2. Description of the Related Art

Continuous developments in the fields of analog and digital circuits (such as microprocessors and high speed communications) need efficient electronic components. Compatibility and the integrity of clock signals within the circuits is one of the important requirements. System clock performance that was previously acceptable is now insufficient to support the high clock speeds of today's circuits.

The duty cycle of high speed clocks is very critical in certain applications such as DDR2 (Double Data Rate 2), where the read/write operation is performed on both rising and falling edges of the clock. Measuring the duty cycle of high speed clocks is thus very critical in these applications. Off chip duty cycle measurement of high speed clocks is not feasible due to speed limitations of IO's and additional distortion caused by intermediate buffers. Hence an on-chip measurement scheme is required to accurately measure the duty cycle of high-speed clock signals.

The measurement of the duty-cycle of a clock signal is an important part of most on-chip PLL BIST solutions. The duty cycle is an important PLL clock specification for DDR2 type applications, and its measurement is a vital part of any PLL BIST solution. Conventional approaches for measuring and correcting duty cycle can be categorized broadly into analog, digital and mixed-signal. Purely analog duty cycle corrector (DCC) circuits like the one proposed by Toru Ogawa, Kenji Taniguchi in ISCAS-2002, Volume 4 titled as "A 50% Duty-Cycle Correction Circuit for PLL Output", consist of a voltage controlled oscillator (VCO), operational amplifiers (OPAMP), phase detectors and frequency filters that make the design extremely resource-hungry. These circuits are obviously not a good choice when die area is the most important constraint. Moreover, in a typical digital BIST environment, purely analog approaches cannot be used.

The vernier delay line (VDL) has been used extensively for measurement of time and time-to-digital conversion. The technique for measuring Time of Flight (TOF) of particles using the VDL technique is proposed by Antonio H. Chan and Gordon W. Roberts in IEEE Trans. On VLSI Systems, Vol. 12, No. 1, January 2004 titled as "A Jitter Characterization System Using a Component-invariant Vernier Delay Line". It measures the time between the Start and Stop signals fed to the VDL with a resolution and requires a multi-stage pipelined asynchronous read out circuit. Both these features are unattractive for a BIST implementation due to the area overhead and need for characterization of the test-circuit.

Thus, conventional VDL based time-to-digital converters require an extensive calibration scheme and use two input clocks or start-stop signals. A common short-coming for such systems is that they cannot be used for very high frequencies.

Therefore, there is a need for a system and method for on-chip duty cycle measurement using a single clock signal that neither requires any reference signal for time-period measurement nor requires a calibration phase.

BRIEF SUMMARY

To achieve the desired objective, one embodiment of the present disclosure describes a system having an apparatus for measuring the duty cycle of a clock signal. In this disclosure, the duty cycle is understood to mean the ratio or percentage of time the clock signal is high relative to the total clock cycle. The apparatus includes a first multi-tap delay module, a second multi-tap delay module, and a multi-element detecting module. The first multi-tap delay module receives the input clock signal CLK and provides a first constant incremental delay at each tap. The second multi-tap delay module simultaneously receives the input clock signal CLK and provides a second constant incremental delay at each tap which is greater than the first constant incremental delay. Each element of the multi-element detecting module has a first input operatively coupled to a selected tap of the first multi-tap delay module, and a second input operatively coupled to a corresponding tap of the second multi-tap delay module. The ratio of the number of outputs of the multi-element detecting module in which the sampled clock level is high with respect to the total number of steps covering one complete clock cycle then determines the duty cycle of the clock signal.

This disclosure also describes an apparatus for measuring the duty cycle of a clock signal. The apparatus includes a first multi-tap delay module, a second multi-tap delay module, and a multi-element detecting module. The first multi-tap delay module receives the input clock signal CLK and provides a first constant incremental delay at each tap. The second multi-tap delay module simultaneously receives the input clock signal CLK and provides a second constant incremental delay at each tap which is greater than the first constant incremental delay. Each element of the multi-element detecting module has a first input operatively coupled to a selected tap of the first multi-tap delay module, and a second input operatively coupled to a corresponding tap of the second multi-tap delay module. The ratio of the number of outputs of the multi-element detecting module in which the sampled clock level is high with respect to the total number of steps covering one complete clock cycle, then determines the duty cycle of the clock signal.

This disclosure further teaches a method for measuring the duty cycle of a clock signal comprising providing a first constant incremental stepped delay to the clock signal, providing a second constant incremental stepped delay to the clock signal where the first constant incremental stepped delay is less than the second constant incremental delay, sampling the level of the first delayed clock signal using the second delayed clock signal at each step, and determining the ratio of the number of steps in which the sampled clock level being high with respect to the total number of steps covering one complete clock cycle.

In accordance with the present disclosure, a circuit is provided that includes a first delay module having a plurality of series-connected buffers forming a tap at each series connection, a second delay module comprising a plurality of series-connected buffers forming a tap at each series connection, and a detecting module comprising a plurality of D Flip-Flops, each D Flip-Flop having a first input coupled to a tap in the first delay module, a second input coupled to a tap in the second delay module, and an output, the outputs of the plurality of D Flip-Flops collectively forming an output of the detecting module, the detecting module structured to determine the ratio of the number of outputs of the detecting module in which a sampled clock signal level is high with respect to one complete clock cycle to thereby determine a duty cycle of the clock signal.

In accordance with another aspect of the foregoing circuit, the first input of the D Flip-Flop includes a D input, the second input of the D Flip-Flop comprises a clock signal input, and the output of the D Flip-Flop comprises a Q output.

In accordance with another aspect of the foregoing circuit, the circuit includes an on-chip system using a single clock signal to determine the duty cycle of the clock signal that neither requires any reference signal for time period measurement nor requires a calibration phase.

In accordance with another aspect of the present disclosure, an on-chip duty cycle measurement circuit is provided that uses a single clock signal that neither requires any reference signal for time period measurement nor requires a calibration phase, the circuit having a first delay module with a plurality of series-connected buffers forming a tap at each series connection and having an input to receive the clock signal and structured to provide a first constant incremental delay at each tap, a second delay module having a plurality of series-connected buffers forming a tap at each series connection, the second delay module having an input to receive the clock signal and structured to provide a second constant incremental delay of the clock signal at each tap, and a detecting module that has a plurality of D Flip-Flops, each D Flip-Flop having a first input coupled to a tap in the first delay module, a second input coupled to a corresponding tap in the second delay module, and an output, the outputs of the plurality of D Flip-Flops collectively forming an output of the detecting module on which is output a duty cycle of the clock signal.

BRIEF DESCRIPTION OF THE SEVERAL VIEWS OF THE DRAWINGS

The aforementioned aspects and other features of the present disclosure will be explained in the following description, taken in conjunction with the accompanying drawings, wherein.

DETAILED DESCRIPTION

Figure 1:
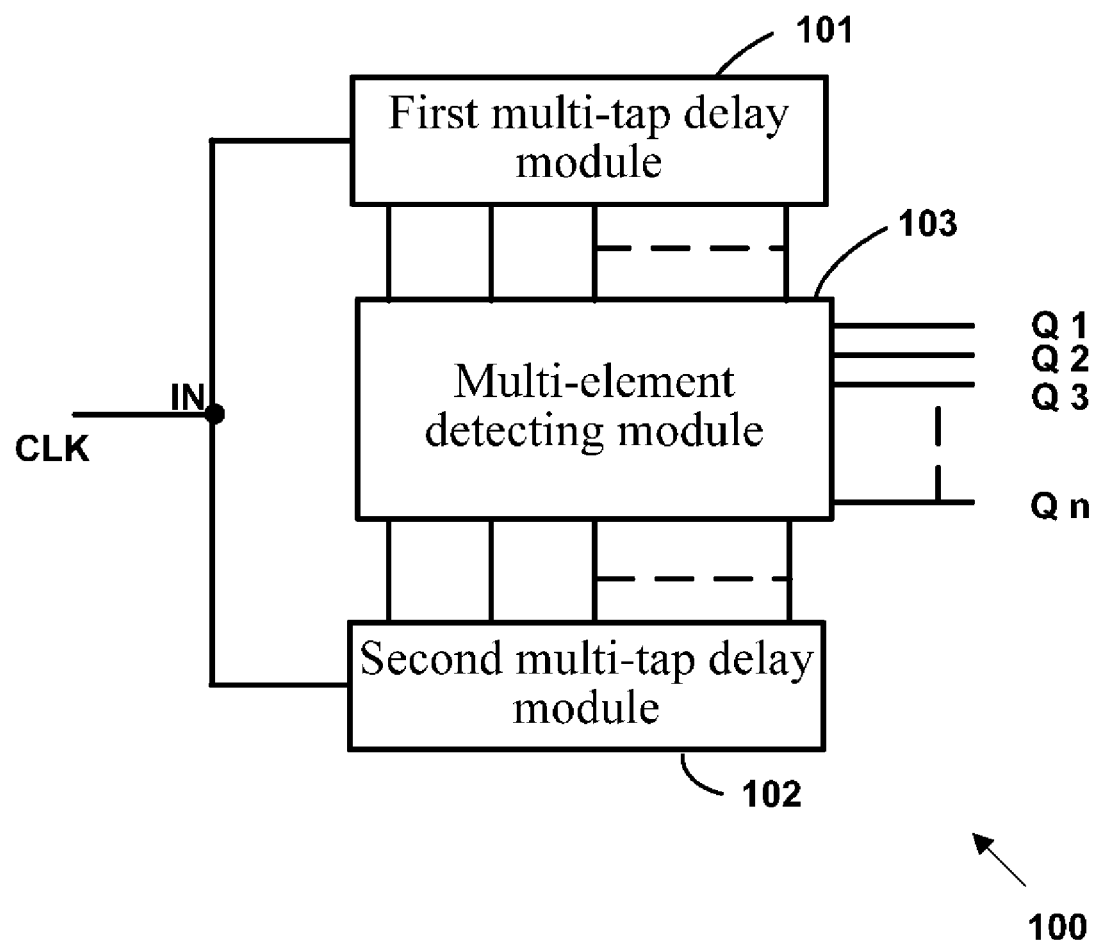
FIG. 1 illustrates the block diagram of an apparatus for measuring the duty cycle of a clock signal according to the present disclosure.

The embodiments of the present disclosure will be described in detail with reference to the accompanying drawings. However, the present disclosure is not limited to these embodiments and can be modified in various forms. The embodiments of the present disclosure described herein are only provided to explain more clearly the present disclosure to one of skill in the art of the present disclosure. In the accompanying drawings, like reference numerals are used to indicate like components.

FIG. 1 illustrates the block diagram of an apparatus 100 for measuring the duty cycle of a clock signal according to the present disclosure. Apparatus 100 includes a first multi-tap delay module 101, a second multi-tap delay module 102, and a multi-element detecting module 103. The input terminal of the first multi-tap delay module 101 is coupled to an input node IN. The input terminal of the second multi-tap delay module 102 is also coupled to input node IN. The first multi-tap delay module 101 provides the input clock signal CLK with a first constant incremental delay at each tap. The second multi-tap delay module 102 provides the input clock signal CLK a second constant incremental delay at each tap. The first constant incremental delay is less than the second constant incremental delay. Each element of the multi-element detecting module 103 has two input terminals. The first input is coupled to a selected tap of the first multi-tap delay module 101 and the second input is coupled to a corresponding tap of the second multi-tap delay module 102. The clock duty cycle is determined by calculating the ratio of the number of outputs (Q1, Q2, - - - Qn) of the multi-element detecting module 103 in which the sampled clock level is high with respect to the total number of steps covering one complete clock cycle.

Figure 2:
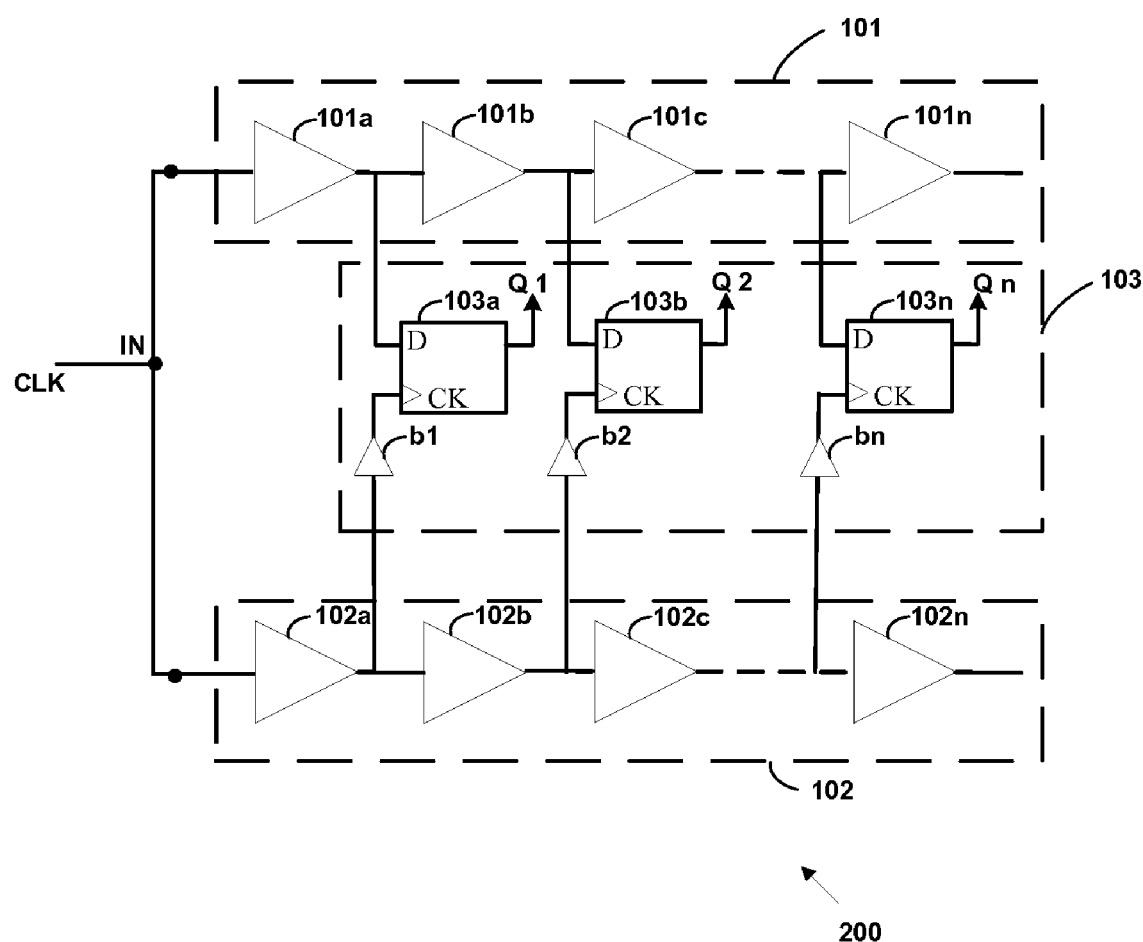
FIG. 2 illustrates the block diagram of an apparatus for measuring the duty cycle of a clock signal according to an embodiment of the present disclosure.

FIG. 2 illustrates the block diagram of an apparatus 200 for measuring the duty cycle of a clock signal according to an embodiment of the present disclosure. The first multi-tap delay module 101 includes a plurality of buffers such as 101a, 101b, 101c, - - - 101n. The second multi-tap delay module 102 also includes a plurality of buffers such as 102a, 102b, 102c, - - - 102n. The multi-element detecting module 103 includes a plurality of D Flip-Flops 103a, 103b, 103c, - - - 103n and a plurality of buffers b1, b2, - - - bn.

The individual buffers 101a, 101b, 101c, - - - 101n of the first multi-tap delay module 101 are coupled to the D input of the respective Flip-Flop of the multi-element detecting module 103. The individual buffer 101a, 101b, 101c, - - - 101n are identical and have a propagation delay "$T_s$." The individual buffers 102a, 102b, 102c, - - - 102n of the second multi-tap delay module 102 are coupled to the clock input (CK) of the respective D Flip-Flop of the multi-element detecting module 103. The individual buffers 102a, 102b, 102c, - - - 102n are also identical but have a propagation "$T_F$" which is less than the propagation delay $T_S$.

The first multi-tap delay module 101 is referred to as the "Fast Buffer Chain (FBC)" while the second multi-tap delay module 102 is called the "Slow Buffer Chain (SBC)". The D Flip-Flop is abbreviated as DFF. The difference in buffer delays is referred to as delta delay $T_D$. Thus $T_D=T_S-T_F$.

When the rising edge of the clock signal is passed through the first buffer of the Fast Buffer Chain (FBC), the edge is delayed by $T_F$ while the same clock signal edge is delayed by Ts when passed through the Slow Buffer Chain (SBC). Thus the first D Flip-Flop (DFF) samples a point at an offset of $T_D$ from the rising edge of the clock signal. The rising edge of the clock appears at the output of the second buffer in the Fast Buffer Chain (FBC) after a delay of 2 $T_F$ while it appears after a delay of 2 $T_S$ at the output of the second buffer. Hence the relative movement of the clock signal as determined by the second D Flip-Flop (DFF) is 2 $T_S$–2 $T_F$=2 $T_D$. Thus the second D Flip-Flop (DFF) samples a point on the clock signal at an offset of 2 $T_D$ from the rising edge. It can be deduced on continuing the process that the outputs of the D Flip-Flop (DFF) actually contain equally spaced samples of the clock under test, sampled at a resolution of $T_D$. By counting the number of "1"s (High-level of the clock signal) say N and the number of "0"s (Low-level of the clock signal) say M, the duty cycle (DC) of the clock under test is DC=N/(N+M).

Figure 3:
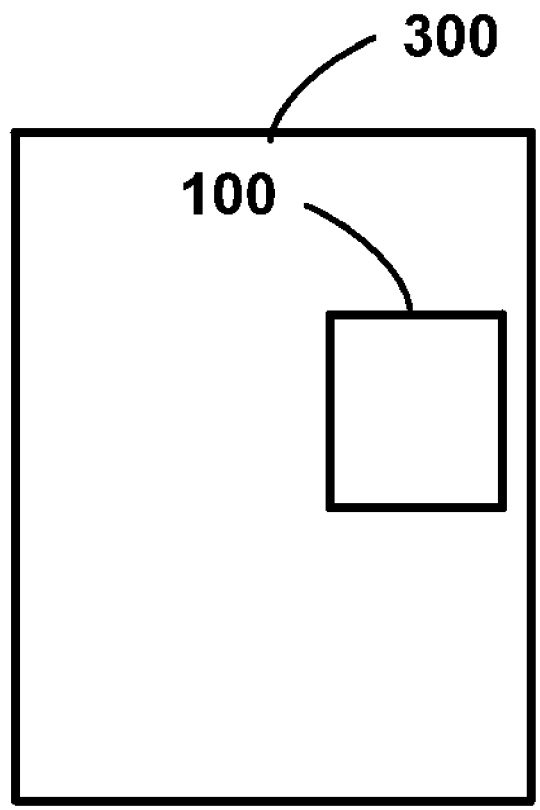
FIG. 3 illustrates a block diagram of a system that uses an apparatus, which measures the duty cycle of a clock signal, according to an embodiment of the present disclosure.

FIG. 3 illustrates a block diagram that discloses an application for an apparatus 100, which measures the duty cycle of a clock signal, according to an embodiment of the present disclosure used in a system 300. The system 300 includes the apparatus 100 which includes the first multi-tap delay module 101, the second multi-tap delay module 102, and the multi-element detecting module 103. The apparatus can include, without limitation, microelectronic circuits, computer systems that use microprocessors, memories, display devices, printers, input devices such as a keyboard or a mouse or a printer and one or more communication devices such as a modem, router, wireless transceiver, and network interface.

Figure 4:
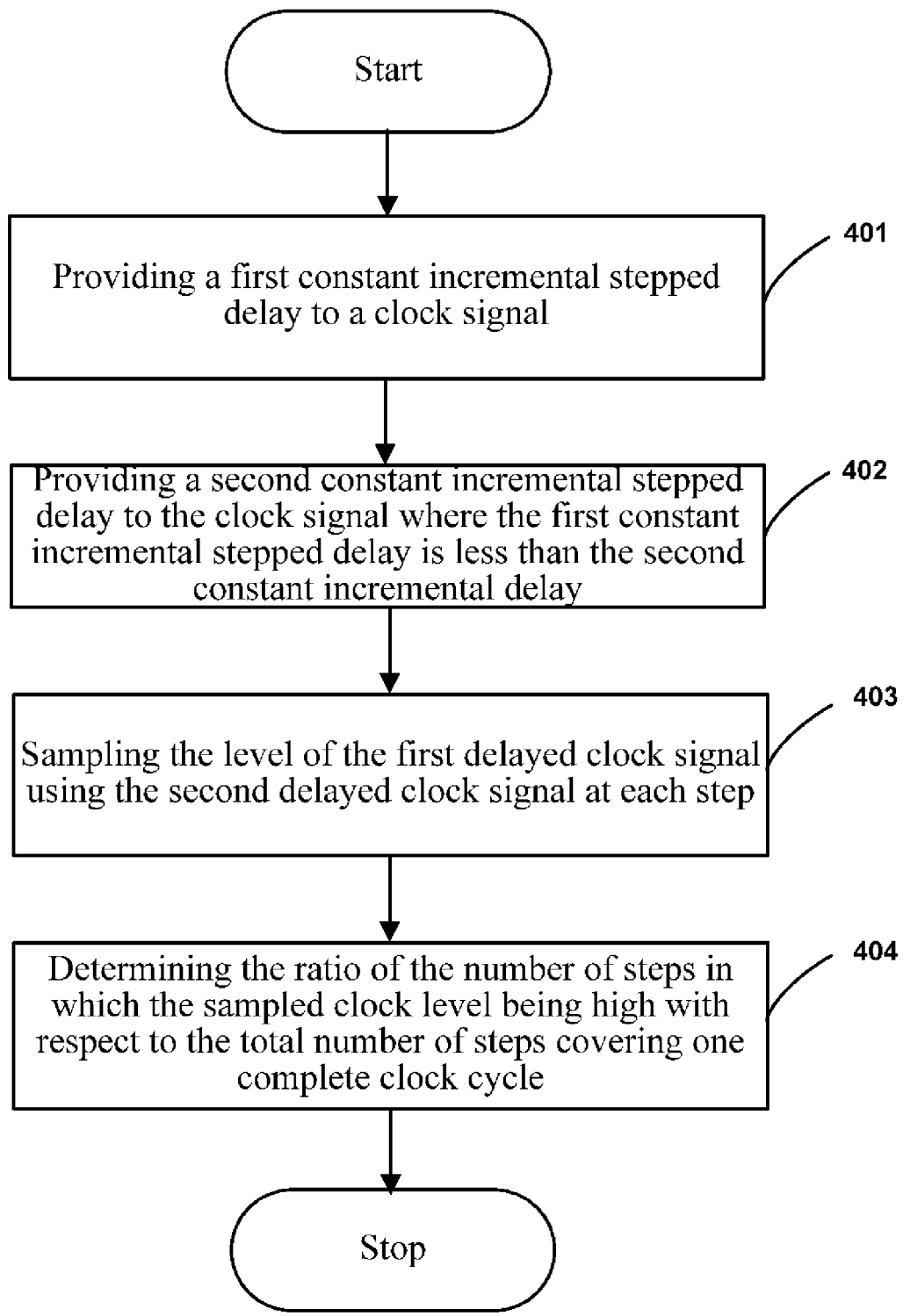
FIG. 4 illustrates a flow diagram of a method for measuring the duty cycle of a clock signal according to an embodiment of the present disclosure.

FIG. 4 illustrates a flow diagram of a method for measuring the duty cycle of a clock signal according to an embodiment of the present disclosure. At step 401, a first constant incremental stepped delay is provided to the clock signal. At step 402, a second constant incremental stepped delay is provided to the clock signal. At step 403, the level of the first delayed clock signal is sampled using the second delayed clock signal at each step of the second delayed clock signal. At step 404, the ratio of the number of steps in which the sampled clock level being high with respect to the total number of steps covering one complete clock cycle is determined An embodiment of the present disclosure also relates to an apparatus for measuring the duty cycle of a clock signal and can be used in various applications, such as on-chip duty cycle measurement.

The present disclosure offers the following advantages:

1. It does not require a reference clock for measuring the duty cycle.

It provides sampling resolutions as low as 10 ps because its resolution is based on the difference between two buffer delays.

3. It does not require calibration of the buffer delays and uses standard cells from the library. Hence the circuit can be very easily synthesized and integrated in an all-digital BIST environment for on-chip characterization of PLL clock.

4. It requires a test time that is equal to the time needed for the clock signal to propagate through the entire buffer chain. For a 400 MHz clock sampled at 10 ps resolution, the measurement time will be equal to 250*2.5 ns=625 ns.

5. The process and supply variations affect both the delay chains equally and hence the sampling resolution is not affected by them.

6. It uses the average sampling resolution, which can be easily determined by dividing the known clock period (T) by the total number of samples in one clock period (N+M).

Although the system and method have been described in connection with an embodiment of the present disclosure illustrated in the accompanying drawings, it is not limited thereto. It will be apparent to those skilled in the art that various substitutions, modifications, and changes may be made thereto without departing from the scope and spirit of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

We claim:

1. A system, comprising:
an apparatus configured to measure a duty cycle of a clock signal, the apparatus including:
a first multi-tap delay module having an input to receive the clock signal, the first multi-tap delay line configured to provide a first constant incremental delay at each tap;
a second multi-tap delay module having an input to receive the clock signal, the second multi-tap delay line configured to provide a second constant incremental delay at each tap where the first constant incremental delay is less than the second constant incremental delay; and
a multi-element detecting module in which each element has a first input operatively coupled to a selected tap of the first multi-tap delay module, and a second input operatively coupled to a corresponding tap of the second multi-tap delay module, the multi-element detecting module structured to determine the ratio of the number of outputs of the multi-element detecting module in which the sampled clock signal level is high with respect to a total number of steps covering one complete clock cycle to thereby determine the duty cycle of the clock signal.

2. The system as claimed in claim 1 wherein the first multi-tap delay module comprises a plurality of buffers.

3. The system as claimed in claim 1 wherein the second multi-tap delay module comprises a plurality of buffers.

4. The system as claimed in claim 1 wherein each element of the multi-element detecting module comprises a D-Flip-Flop.

5. An apparatus for measuring the duty cycle of a clock signal, the apparatus comprising:
a first multi-tap delay module having an input to receive the clock signal, the first multi-tap delay line configured to provide a first constant incremental delay at each tap;
a second multi-tap delay module having an input to receive the clock signal, the second multi-tap delay line configured to provide a second constant incremental delay at each tap where the first constant incremental delay is less than the second constant incremental delay; and
a multi-element detecting module in which each element has a first input operatively coupled to a selected tap of the first multi-tap delay module, and a second input operatively coupled to a corresponding tap of the second multi-tap delay module, the multi-element detecting module structured to determine the ratio of the number of outputs of the multi-element detecting module in which the sampled clock level is high with respect to a total number of steps covering one complete clock cycle to thereby determine the duty cycle of the clock signal.

6. The apparatus as claimed in claim 5 wherein the first multi-tap delay module comprises a plurality of buffers.

7. The apparatus as claimed in claim 5 wherein the second multi-tap delay module comprises a plurality of buffers.

8. The apparatus as claimed in claim 5 wherein each element of the multi-element detecting module includes a D-Flip-Flop and a buffer element.

9. A method for measuring the duty cycle of a clock signal comprising:
providing a first constant incremental stepped delay to the clock signal;
providing a second constant incremental stepped delay to the clock signal where the first constant incremental stepped delay is less than the second constant incremental delay;
sampling a level of the first delayed clock signal using the second delayed clock signal at each step of the second delayed clock signal; and
determining a ratio of a number of steps in which the sampled clock level is high with respect to a total number of steps covering one complete clock cycle.

10. A circuit, comprising:
a first delay module having a plurality of series-connected buffers forming a tap at each series connection;
a second delay module having a plurality of series-connected buffers forming a tap at each series connection; and
a detecting module having a plurality of D Flip-Flops, each D Flip-Flop having a first input coupled to a tap in the first delay module, a second input coupled to a tap in the second delay module, and an output, the outputs of the plurality of D Flip-Flops collectively forming an output of the detecting module, the detecting module structured to output the ratio of the number of outputs of the detecting module in which a sampled clock signal level is high with respect to one complete clock cycle to thereby determine a duty cycle of the clock signal.

11. The circuit of claim 10 wherein the first input of the D Flip-Flop includes a D input, the second input of the D Flip-Flop includes a clock signal input, and the output of the D Flip-Flop includes a Q output.

12. The circuit of claim 10, comprising an on-chip system using a single clock signal to determine the duty cycle of the clock signal that neither requires any reference signal for time period measurement nor requires a calibration phase.

13. The circuit of claim 12 wherein the system comprises a computer system having a microprocessor, a memory, and at least one from among a display device, an input device, and a communication device.

14. An on-chip duty cycle measurement circuit configured to use a single clock signal that neither requires any reference signal for time period measurement nor requires a calibration phase, the circuit comprising:
a first delay module having a plurality of series-connected buffers forming a tap at each series connection and having an input to receive the clock signal and structured to provide a first constant incremental delay at each tap;
a second delay module having a plurality of series-connected buffers forming a tap at each series connection, the second delay module having an input to receive the clock signal and structured to provide a second constant incremental delay of the clock signal at each tap; and
a detecting module that includes a plurality of D Flip-Flops, each D Flip-Flop having a first input coupled to a tap in the first delay module, a second input coupled to a corresponding tap in the second delay module, and an output, the outputs of the plurality of D Flip-Flops collectively forming an output of the detecting module on which is output a duty cycle of the clock signal.

15. The circuit of claim 14 wherein the detecting module is configured to determine the duty cycle of the clock signal from a ratio of a number of outputs of the detecting module in which the sampled clock signal level is high with respect to one complete clock cycle.

16. The circuit of claim 15 wherein the first input of each D Flip-Flop is a D input, the second input of each D Flip-Flop is a clock input, and the output of each D Flip-Flop is a Q output.

17. The circuit of claim 16 wherein the detecting module is configured to sample a level of the delayed clock signal in the first delay module using the delayed clock signal from the second delay module.

* * * * *